(12) United States Patent
Wu et al.

(10) Patent No.: US 9,019,114 B1
(45) Date of Patent: Apr. 28, 2015

(54) DEVICE MANAGEMENT MODULE, REMOTE MANAGEMENT MODULE AND DEVICE MANAGEMENT SYSTEM EMPLOYING SAME

(71) Applicant: Delta Electronics, Inc., Taoyuan Hsien (TW)

(72) Inventors: Chien-Lung Wu, Taoyuan Hsien (TW); Wen-Hsiang Lin, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 7 days.

(21) Appl. No.: 14/134,304

(22) Filed: Dec. 19, 2013

(30) Foreign Application Priority Data

Oct. 18, 2013  (TW) .............................. 102137772 A (51) Int. Cl.
  *G08B 21/00* (2006.01)
  *H02J 1/00* (2006.01)
  *G08B 21/18* (2006.01)

(52) U.S. Cl.
  CPC ................. *H02J 1/00* (2013.01); *G08B 21/182* (2013.01)

(58) Field of Classification Search
  CPC ......... G06F 1/26; G06F 13/4081; G06F 1/30; G06F 1/3203; G06F 11/30; G06F 1/181; H05K 7/1487; H05K 7/1457; H05K 7/1488; H05K 7/1489; H05K 7/20772; H05K 7/20781; H05K 7/1492
  USPC .......................... 340/657–660, 664, 635, 540, 340/572.1–572.8, 10.1, 539.1, 539.13, 500, 340/505, 568.2; 327/1; 709/220, 223, 224; 361/724; 713/300
  See application file for complete search history.

(56) References Cited

U.S. PATENT DOCUMENTS

| | | | |
|---|---|---|---|
| 6,608,406 B2 * | 8/2003 | Bersiek ......................... | 307/125 |
| 7,652,889 B2 * | 1/2010 | Larson et al. ................. | 361/749 |
| 7,856,495 B2 * | 12/2010 | Chainer et al. ............... | 709/223 |
| 7,857,214 B2 * | 12/2010 | Saliaris ......................... | 235/383 |
| 8,094,020 B2 * | 1/2012 | Groth et al. ................. | 340/568.2 |
| 2003/0046339 A1 * | 3/2003 | Ip ................................. | 709/203 |
| 2009/0189767 A1 * | 7/2009 | Primm et al. ............. | 340/572.1 |
| 2012/0217954 A1 * | 8/2012 | Cook ........................ | 324/123 R |
| 2013/0020868 A1 * | 1/2013 | Wu et al. ........................ | 307/18 |
| 2014/0253093 A1 * | 9/2014 | Bermudez Rodriguez et al. ........................ | 324/76.11 |

\* cited by examiner

*Primary Examiner* — George Bugg
*Assistant Examiner* — Edny Labbees
(74) *Attorney, Agent, or Firm* — Kirton McConkie; Evan R. Witt (57) ABSTRACT

A device management system includes a bus bar, a device management module, and a remote management module. The device management module includes at least one remotely-controllable switching circuit and a detecting circuit. When a device is installed in the rack cabinet, the remotely-controllable switching circuit connected with the device is enabled by the detecting circuit. The remote management module is in communication with the remotely-controllable switching circuit and the detecting circuit through the bus bar. The information of the device is acquired by the remote management module through the remotely-controllable switching circuit. A switch element of the remotely-controllable switching circuit which is connected to the device is selectively turned on or turned off by the remote management module. When the switch element is turned on, the DC power is transmitted to the device through the switch element.

20 Claims, 6 Drawing Sheets

DEVICE MANAGEMENT MODULE, REMOTE MANAGEMENT MODULE AND DEVICE MANAGEMENT SYSTEM EMPLOYING SAME

FIELD OF THE INVENTION

The present invention relates to a device management system, and more particularly to a device management system for remotely controlling devices of a rack cabinet of a data center and resuming any device which is suffered from breakdown or shutdown. The present invention also relates to a device management module and a remote management module of the device management system.

BACKGROUND OF THE INVENTION

With increasing development of computing technologies and networking technologies, the services and functions provided through networks are gradually increased. A data center is a facility used to house computers or servers. For providing intensive network applications, the number of computers or servers of the data center is gradually increased. Generally, a plurality of devices are accommodated within a rack cabinet of the data center in a hot-swappable manner. In addition, the data center may comprise a plurality of rack cabinets. For providing more services and functions, the number of devices within the data center is increased. Consequently, power supply, power distribution and power management become important issues. Conventionally, in the rack cabinet of the data center, a power distribution unit is used to distribute power among the devices.

When AC power (e.g. utility power) is received by the rack cabinet, the AC power is transmitted from the power distribution unit to all devices within the rack cabinet. Each device has a power supply unit for receiving the AC power and converting the AC power into DC power, thereby powering circuitry of the device. Moreover, if one of the devices within the rack cabinet is suffered from breakdown or shutdown, the power distribution unit is responsible for stopping providing power to all devices within the rack cabinet. Consequently, the device which is suffered from breakdown or shutdown may be resumed.

However, since the device has the power supply unit, the volume of the device is relatively bulky. Moreover, since the inner space of the rack cabinet is limited, the number of devices accommodated within the rack cabinet is restricted by the volume of the device. Moreover, since the power supply unit is disposed within the device, the heat-dissipating efficacy is usually unsatisfied. Moreover, if any device within the rack cabinet is suffered from breakdown or shutdown, it is necessary to stop the power distribution unit from providing electric power to all devices of the rack cabinet. In other words, the electric power to the device which is suffered from breakdown or shutdown cannot be stopped individually. Under this circumstance, the utilization flexible of the rack cabinet is impaired. Moreover, for manually removing the device which is suffered from breakdown or shutdown and resuming the device, the worker has to move the data center to successively check all devices of the rack cabinet. After the device which is suffered from breakdown or shutdown is searched, the user may start repairing or resuming the device. In other words, the way of maintaining or resuming the device of the rack cabinet is time-consuming and labor-intensive.

For reducing the volume of the device and enhancing the heat-dissipating efficacy of the device, a power shelf is installed in the rack cabinet and the power distribution unit is omitted. The power shelf is used for converting AC power into DC power and transmitting the DC power to all devices of the rack cabinet. Under this circumstance, it is not necessary to install the power supply unit in each device. Consequently, the volume of the device is reduced, and the heat-dissipating efficacy of the device is enhanced. Since the power shelf does not have the function of controlling power to one or more devices, if the device within the rack cabinet is suffered from breakdown or shutdown, the user may manually remove the device which is suffered from breakdown or shutdown and resume the device. Similarly, the way of maintaining or resuming the device of the rack cabinet is time-consuming and labor-intensive.

Therefore, there is a need of providing a device management module, a remote management module and a device management system in order to eliminate the above drawbacks.

SUMMARY OF THE INVENTION

The present invention provides a device management module, a remote management module and a device management system. The device management system uses the device management module and the remote management module to individually and remotely control the devices within the rack cabinet. If any device within the rack cabinet is suffered from breakdown or shutdown, according to a command from the remote management module, a switch element of a remotely-controllable switching circuit is controlled to be in an off state. Since the switch element is turned off, the DC power is no longer received by the device which is suffered from breakdown or shutdown. Consequently, the purpose of resuming the device is achieved. In comparison with the conventional method of manually resuming the device, the use of the device management system of the present invention is time-saving and labor-saving.

The present invention provides a device management system for monitoring all devices of the rack cabinet and storing and analyzing real-time data of the devices, thereby providing the information about the maintenance and the life of the device.

In accordance with an aspect of the present invention, there is provided a device management system for managing at least one hot-swappable device within a rack cabinet. The device management system includes a bus bar, a device management module, and a remote management module. The bus bar is used for transferring signals and DC power. The device management module is used for monitoring whether the device is installed in the rack cabinet and collecting information of the device which is installed in the rack cabinet. The device management module includes at least one remotely-controllable switching circuit and a detecting circuit. The remotely-controllable switching circuit is installed in an installation block. A first end of the remotely-controllable switching circuit is connected with the bus bar. A second end of the remotely-controllable switching circuit is connected with the device which is installed in the rack cabinet. During operation of the remotely-controllable switching circuit, the information of the device is collected by the remotely-controllable switching circuit in real time. The detecting circuit is connected with the bus bar and in communication with the remotely-controllable switching circuit for detecting whether the device is installed in the rack cabinet. A location table about a location of the remotely-controllable switching circuit in the installation block is previously stored in the detecting circuit. When the device is installed in the rack cabinet, the remotely-controllable switching circuit connected with the device is enabled by the detecting circuit according to the location table. The remote management module is in communication with the remotely-controllable switching circuit and the detecting circuit through the bus bar. The information of the device is acquired by the remote management module through the remotely-controllable switching circuit. A switch element of the remotely-controllable switching circuit which is connected to the device is selectively turned on or turned off by the remote management module. When the switch element is turned on, the DC power is transmitted to the device through the switch element.

In accordance with another aspect of the present invention, there is provided a device management module of a device management system for monitoring at least one hot-swappable device within a rack cabinet and collecting information of the device. The device management module includes at least one remotely-controllable switching circuit and a detecting circuit. The remotely-controllable switching circuit is installed in an installation block. A first end of the remotely-controllable switching circuit is connected with a bus bar. A second end of the remotely-controllable switching circuit is connected with the device which is installed in the rack cabinet. During operation of the remotely-controllable switching circuit, the information of the device is collected by the remotely-controllable switching circuit in real time. The detecting circuit is connected with the bus bar and in communication with the remotely-controllable switching circuit for detecting whether the device is installed in the rack cabinet. A location table about a location of the remotely-controllable switching circuit in the installation block is previously stored in the detecting circuit. When the device is installed in the rack cabinet, the remotely-controllable switching circuit connected with the device is enabled by the detecting circuit according to the location table.

In accordance with a further aspect of the present invention, there is provided a remote management module of a device management system. The remote management module is in communication with a remotely-controllable switching circuit and a detecting circuit of the device management system. The remote management module includes a power management unit, a device management unit, a main management unit, a storage unit, a user interface unit, and a warning management unit. The power management unit is connected with the bus bar for monitoring a DC power which is received by a device connected with the remotely-controllable switching circuit. The device management unit is connected with the bus bar for collecting information of the device connected with the remotely-controllable switching circuit in real time. The main management unit is used for receiving the information of the device through the device management unit. The information of the device is analyzed and processed by the main management unit according to a setting condition. A power status of the device is realized by the main management unit through the power management unit. After the information of the device is analyzed and processed by the main management unit, processed information of the device is obtained. The processed information and the power status are stored in or read from the storage unit in real time. The user interface unit is connected with the main management unit. An external data is inputted into the main management unit through the user interface unit. The warning management unit is connected with the main management unit. If the main management unit confirms that a protection condition of the device is satisfied, the warning management unit is driven to implement a waning process.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
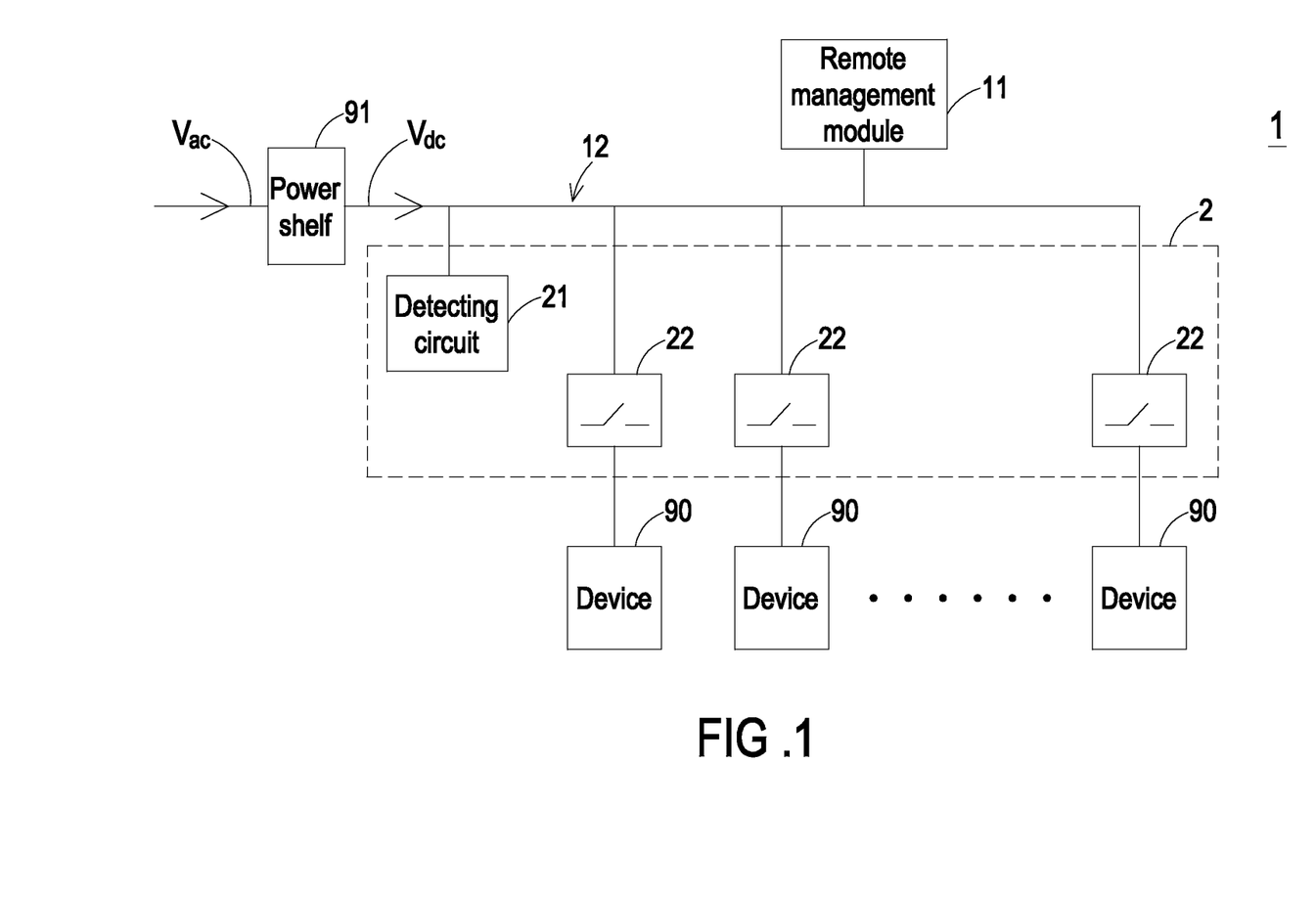
FIG. 1 schematically illustrates the architecture of a device management system according to an embodiment of the present invention.
Figure 2:
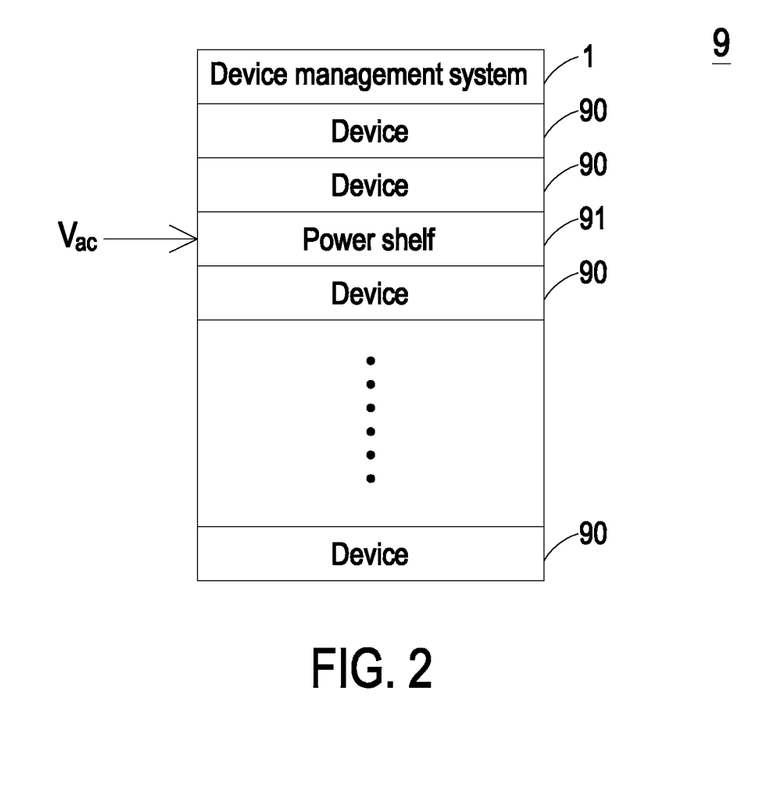
FIG. 2 schematically illustrates a rack cabinet used in the device management system of FIG. 1.

FIG. 1 schematically illustrates the architecture of a device management system according to an embodiment of the present invention. FIG. 2 schematically illustrates a rack cabinet used in the device management system of FIG. 1. As shown in FIG. 1, the device management system (DMS) 1 is used for automatically and efficiently managing at least one device 90 within a rack cabinet 9 (see FIG. 2). The rack cabinet 9 is installed in a data center. An example of the device 90 includes but is not limited to a computer or a server. The device 90 may be installed in the rack cabinet 9 in a hot swappable manner. Moreover, a power shelf 91 is disposed within the rack cabinet 9 for receiving AC power Vac (i.e. utility power) and converting the AC power Vac into DC power Vdc, thereby powering all devices 90 of the rack cabinet 9.

The device management system 1 comprises a remote management module 11, a bus bar 12, and a device management module (DMM) 2. The bus bar 12 has the functions of transferring signals and electric power. For example, the bus bar 12 comprises a power cable (not shown) for transferring electric power and a signal cable (not shown) for transferring signals. Moreover, the signal cable can transfer signals complying with a power line communication protocol. The bus bar 12 is connected with the power shelf 91 for receiving the DC power Vdc from the power shelf 91. That is, the bus bar 12 not only provides a path of transferring electric power but also provides a path of transferring monitor signals of the device management system 1.

Figure 5:
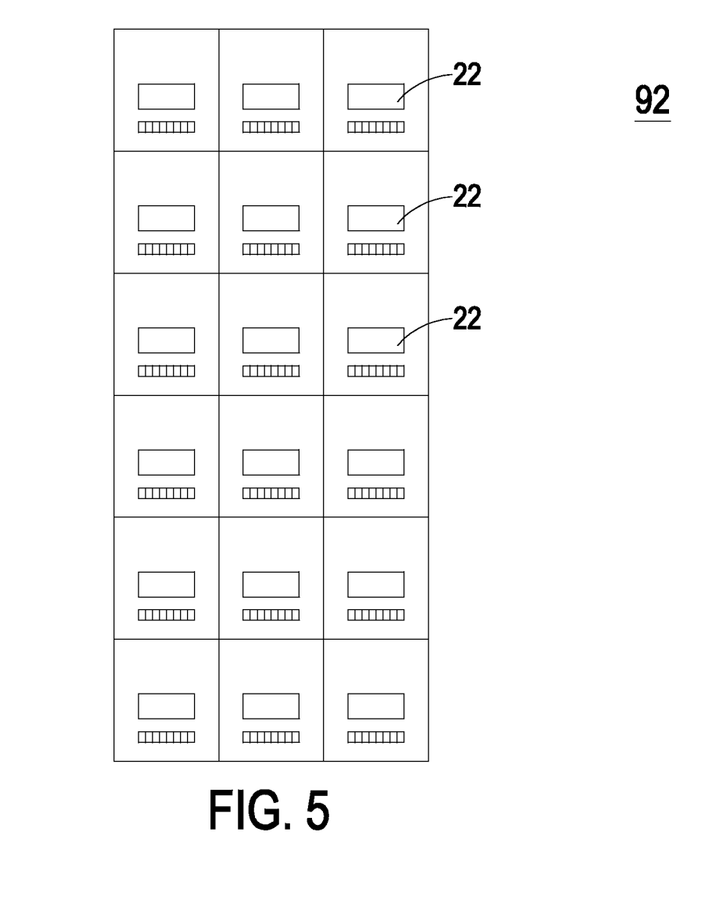
FIG. 5 schematically illustrates an installation block for installing the remotely-controllable switching circuit of the device management system of FIG. 1.

The device management module 2 is connected with the bus bar 12. When the device 90 is installed in the rack cabinet 9, the device management module 2 is connected with the device 90. The device management module 2 is used for initializing and designating an actual position of the device 90 in the rack cabinet 9, monitoring whether the device 90 is installed in the rack cabinet 9 and collecting the information of the device 90 in the rack cabinet 9. The device management module 2 further comprises a detecting circuit 21 and at least one remotely-controllable switching circuit 22. The device management module 2 comprises one remotely-controllable switching circuit 22 or a plurality of remotely-controllable switching circuits 22. The number of the at least one remotely-controllable switching circuit 22 is equal to the number of the at least one device 90. The remotely-controllable switching circuit 22 is disposed within the rack cabinet 9, and installed in an installation block 92 (see FIG. 5). The installation block 92 is arranged between the bus bar 12 and the device 90. An example of the installation block 92 includes but is not limited to an installation plate. Moreover, before the rack cabinet 9 leaves the factory, the installation block 92 is installed in the rack cabinet 9. A first end of the remotely-controllable switching circuit 22 is connected with the bus bar 12. A second end of the remotely-controllable switching circuit 22 is connected with a corresponding device 90 which is installed in the rack cabinet 9. During operations, the information of the device 90 may be collected by the remotely-controllable switching circuit 22 in real time. Moreover, each remotely-controllable switching circuit 22 has a unique identification number. When the device management system 1 is operated, the remotely-controllable switching circuit 22 is registered to the detecting circuit 21 according to the identification number. After the remotely-controllable switching circuit 22 is registered, a location identification code of the remotely-controllable switching circuit 22 in the rack cabinet 9 is acquired. The detecting circuit 21 is in communication with the remotely-controllable switching circuit 22 through the bus bar 12. Consequently, a location table about the remotely-controllable switching circuit 22 of the installation block 92 is established by the detecting circuit 21. When the remotely-controllable switching circuit 22 is connected with the device 90, the remotely-controllable switching circuit 22 connected with the device 90 is enabled by the detecting circuit 21 according to the location table, and associated data is transmitted from the detecting circuit 21 to the device 90. Accordingly, the device 90 can be registered to the remote management module 11.

Figure 3:
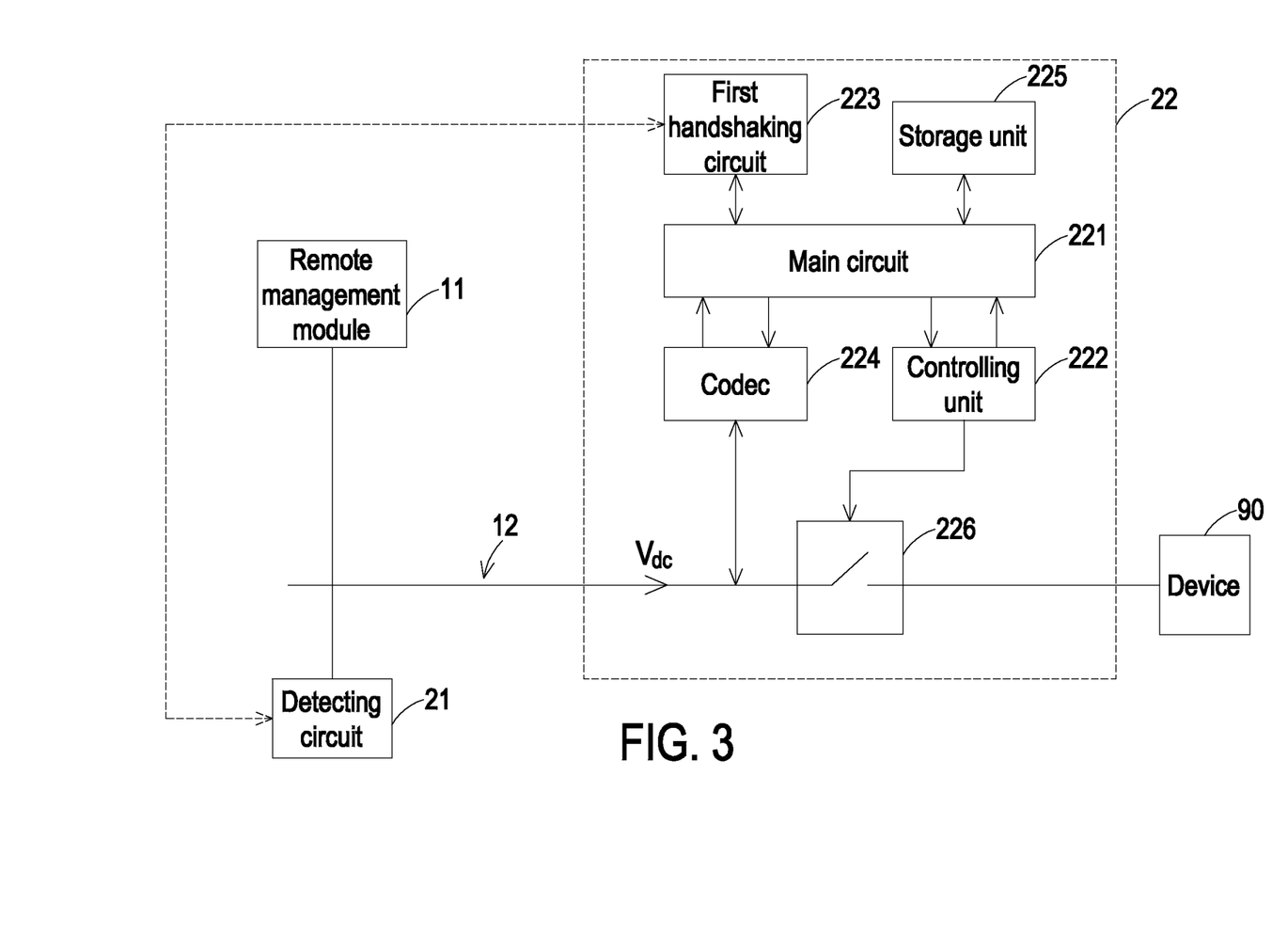
FIG. 3 is a schematic circuit block diagram illustrating the remotely-controllable switching circuit of the device management system of FIG. 1.

The remote management module 11 is connected with the bus bar 12. In addition, the remote management module 11 is in communication with the remotely-controllable switching circuit 22 and the detecting circuit 21 through the bus bar 12. The information of the device 90 may be acquired by the remote management module 11 through the remotely-controllable switching circuit 22. In addition, the remote management module 11 may monitor all statuses of the device 90. The statuses of the device 90 includes the type of the device 90, the voltage of the device 90, the current of the device 90, the operating status of the device 90 and the location message of the device 90. Moreover, according to a command from the remote management module 11, a switch element 226 (as shown in FIG. 3) of the remotely-controllable switching circuit 22 is selectively turned on or turned off, so that the path of the DC power Vdc to the device 90 is selectively conducted or interrupted. The switch element 226 is located in the path of the DC power Vdc to the device 90. For example, the switch element 226 is arranged between the power shelf 91 and the device 90, and connected with an input terminal of the device 90. When the switch element 226 is turned on according to the command from the remote management module 11, the DC power Vdc is transmitted to the device 90 through the switch element 226 in order to power the device 90.

The operations of the device management system of FIG. 1 will be illustrated in more details as follows. After the device 90 is installed in the rack cabinet 9 and connected with the remotely-controllable switching circuit 22 of the installation block 92, the detecting circuit 21 detects that the device 90 is connected with the remotely-controllable switching circuit 22. Consequently, the remotely-controllable switching circuit 22 is enabled by the detecting circuit 21. After the remotely-controllable switching circuit 22 is enabled, the switch element 226 of the remotely-controllable switching circuit 22 is turned on, and the DC power Vdc is transmitted to the device 90 to power the device 90. During operations of the remotely-controllable switching circuit 22, the information of the device 90 is collected by the remotely-controllable switching circuit 22 in real time. In addition, the identification number of the remotely-controllable switching circuit 22 is transmitted to the detecting circuit 21. According to the identification number, the remotely-controllable switching circuit 22 is registered to the detecting circuit 21. During the registering process, the identification number is compared with the location table by the detecting circuit 21. Consequently, an address of the remotely-controllable switching circuit 22 which is connected with the device 90 is realized by the detecting circuit 21. In other words, the remotely-controllable switching circuit 22 is located by the detecting circuit 21. Then, a registration message is transmitted from the detecting circuit 21 to the device 90 through the bus bar 12. The registration message contains a serial number of the rack cabinet 9, the identification number and a location identification code of the remotely-controllable switching circuit 22. According to the registration message, the device 90 can be registered to the remote management module 11. Since different remotely-controllable switching circuits 22 have different identification numbers, the location identification codes contained in the registration messages are independent and different. After the location identification code of the remotely-controllable switching circuit 22 which is connected with the device 90 is realized by the remote management module 11, the switch element 226 of the remotely-controllable switching circuit 22 is selectively turned on or turned off according to the location identification code. Consequently, if any device 90 within the rack cabinet 9 is suffered from breakdown or shutdown, the switch element 226 of the remotely-controllable switching circuit 22 is controlled to be in the off state according to the location identification code of the remotely-controllable switching circuit 22. Under this circumstance, the device 90 which is suffered from breakdown or shutdown fails to receive the DC power Vdc, and thus the device 90 can be resumed. Of course, for disabling a normally-operated device 90, the location identification code of the remotely-controllable switching circuit 22 which is connected with the device 90 may be realized by the remote management module 11. According to the location identification code of the remotely-controllable switching circuit 22, the switch element 226 of the remotely-controllable switching circuit 22 which is connected with the normally-operated device 90 is controlled to be in the off state. Under this circumstance, the normally-operated device 90 fails to receive the DC power Vdc, and thus the device 90 can be resumed. Moreover, if the device 90 is removed from the rack cabinet 9 and disconnected from the corresponding remotely-controllable switching circuit 22, the remotely-controllable switching circuit 22 is disabled by the detecting circuit 21. Consequently, the switch element 226 is controlled to be in the off state.

FIG. 3 is a schematic circuit block diagram illustrating the remotely-controllable switching circuit of the device management system of FIG. 1. As shown in FIG. 3, the remotely-controllable switching circuit 22 comprises a main circuit 221, a controlling unit 222, a first handshaking circuit 223, a codec 224 (i.e. encoder/decoder), a storage unit 225, and a remotely-controllable switch element 226 (hereinafter called "switch element"). The codec 224 is connected with the bus bar 12. When a signal is transmitted from the detecting circuit 21 or the remote management module 11 to the remotely-controllable switching circuit 22 through the bus bar 12, the signal is decoded by the codec 224. In addition, the signal to be outputted from the remotely-controllable switching circuit 22 through the bus bar 12 is firstly encoded by the codec 224. The first handshaking circuit 223 is connected with a second handshaking circuit 213 of the detecting circuit 21 (see FIG. 4) and the main circuit 221. Consequently, a handshaking function of exchanging information between the first handshaking circuit 223 and the second handshaking circuit 213 can be achieved. In other words, the remotely-controllable switching circuit 22 and the detecting circuit 21 are in communication with each other through the first handshaking circuit 223 and the second handshaking circuit 213. The storage unit 225 is connected with the main circuit 221 for storing the information of the device 90. In addition, the identification number of the remotely-controllable switching circuit 22 is previously stored in the storage unit 225. According to the identification number, the remotely-controllable switching circuit 22 can be in communication with the remote management module 11 and the detecting circuit 21. The controlling unit 222 is connected with the switch element 226 for controlling the on/off states of the switch element 226. The main circuit 221 is connected with the controlling unit 222, the first handshaking circuit 223, the codec 224 and the storage unit 225. The main circuit 221 is used for controlling the overall operations of the remotely-controllable switching circuit 22. For example, the signal from the first handshaking circuit 223 or the signal from the codec 224 may be analyzed, processed, collected, calculated and/or integrated by the main circuit 221. According to the signal from the first handshaking circuit 223 or the signal from the codec 224, the controlling unit 222 is driven by the main circuit 221 so as to control the on/off states of the switch element 226. Moreover, after the signal from the first handshaking circuit 223 or the signal from the codec 224 is analyzed, processed, collected, calculated and/or integrated by the main circuit 221, the analyzed or processed result is stored in the storage unit 225. Moreover, the data stored in the storage unit 225 may be read by the main circuit 221.

After the device 90 is installed in the rack cabinet 9 and connected with the switch element 226 of the corresponding remotely-controllable switching circuit 22, the connection between the device 90 and the switch element 226 is detected by the detecting circuit 21. Consequently, through the second handshaking circuit 213 and the first handshaking circuit 223, the main circuit 221 of the remotely-controllable switching circuit 22 which is connected with the device 90 is enabled by the detecting circuit 21. Meanwhile, the controlling unit 222 is driven by the main circuit 221 to control the switch element 226 to be in the on state. In addition, the identification number stored in the storage unit 225 is transmitted from the main circuit 221 to the detecting circuit 21 through the second handshaking circuit 213 and the first handshaking circuit 223. Consequently, the identification number of the remotely-controllable switching circuit 22 is registered to the detecting circuit 21. After the remotely-controllable switching circuit 22 is registered, a location identification code of the remotely-controllable switching circuit 22 in the rack cabinet 9 is acquired. On the other hand, when the detecting circuit 21 detects that the device 90 is removed from the rack cabinet 9, the main circuit 221 of the remotely-controllable switching circuit 22 which is originally connected with the device 90 is disabled by the detecting circuit 21 through the second handshaking circuit 213 and the first handshaking circuit 223. Meanwhile, the controlling unit 222 is driven by the main circuit 221 to control the switch element 226 to be in the off state. Moreover, if the device 90 within the rack cabinet 9 is suffered from breakdown or shutdown, the remote management module 11 issues a command to the codec 224 through the bus bar 12. After the command is decoded by the codec 224 and transmitted to the main circuit 221, the controlling unit 222 is driven by the main circuit 221 to control the switch element 226 to be in the off state. Under this circumstance, the device 90 which is suffered from breakdown or shutdown fails to receive the DC power Vdc.

Figure 4:
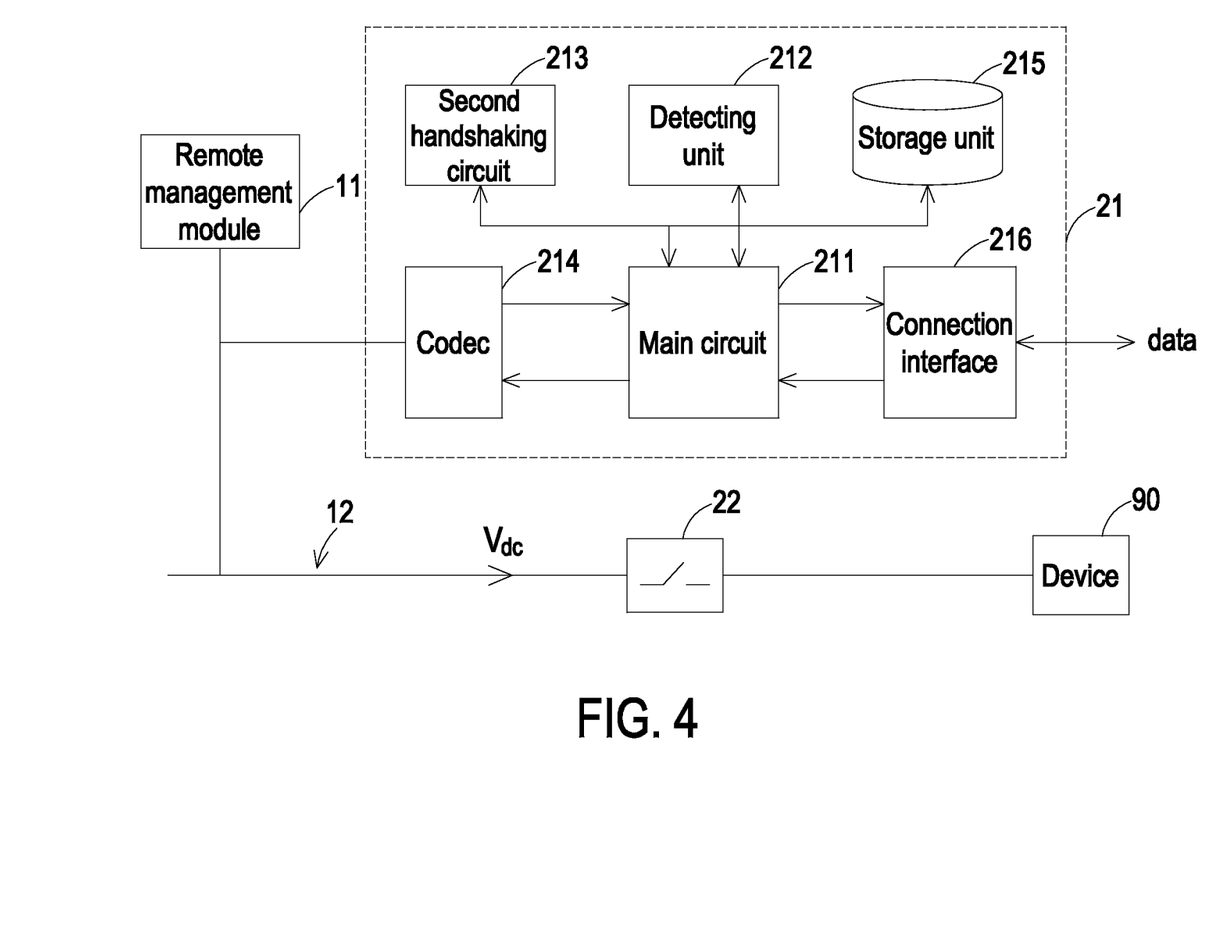
FIG. 4 is a schematic circuit block diagram illustrating the detecting circuit of the device management system of FIG. 1.

FIG. 4 is a schematic circuit block diagram illustrating the detecting circuit of the device management system of FIG. 1. As shown in FIG. 4, the detecting circuit 21 comprises a main circuit 211, a detecting unit 212, the second handshaking circuit 213, a codec 214, a storage unit 215, and a connection interface 216. The codec 214 is connected with the bus bar 12. When a signal from the bus bar 12 is received, the signal is decoded by the codec 214. In addition, the signal to be outputted from the detecting circuit 21 through the bus bar 12 is firstly encoded by the codec 214. The second handshaking circuit 213 is connected with the first handshaking circuit 223 of the remotely-controllable switching circuit 22 and the main circuit 211. Consequently, a handshaking function of exchanging information between the first handshaking circuit 223 and the second handshaking circuit 213 can be achieved. In other words, the detecting circuit 21 and the remotely-controllable switching circuit 22 are in communication with each other through the first handshaking circuit 223 and the second handshaking circuit 213. The detecting unit 212 is connected with the main circuit 211 for detecting whether the device 90 is connected with the rack cabinet 9. According to the detecting result of the detecting unit 212, the main circuit 211 issues a command to the remotely-controllable switching circuit 22 which is connected with the device 90 through the first handshaking circuit 223 and the second handshaking circuit 213. According to the command, the path of the DC power Vdc to the device 90 is selectively conducted or interrupted. An example of the connection interface 216 includes but is not limited to a RS-232 interface or an Ethernet interface for receiving an external data. Consequently, the location table of the detecting circuit 21 may be updated through the connection interface 216. The storage unit 215 is used for storing the location table or associated data. The main circuit 211 is connected with the detecting unit 212, the second handshaking circuit 213, the codec 214, the storage unit 215 and the connection interface 216. The main circuit 211 is used for controlling the overall operations of the detecting circuit 21. For example, the signal from the second handshaking circuit 213 or the signal from the codec 214 may be analyzed, processed, collected, calculated and/or integrated by the main circuit 211. According to the detecting result of the detecting unit 212, the remotely-controllable switching circuit 22 is enabled or disabled by the main circuit 211 through the second handshaking circuit 213. Moreover, the received data may be stored in the storage unit 215 by the main circuit 211. Moreover, the data stored in the storage unit 215 may be read by the main circuit 211. Moreover, the registration message may be transmitted from the main circuit 211 to the device 90 through the bus bar 12.

Figure 6:
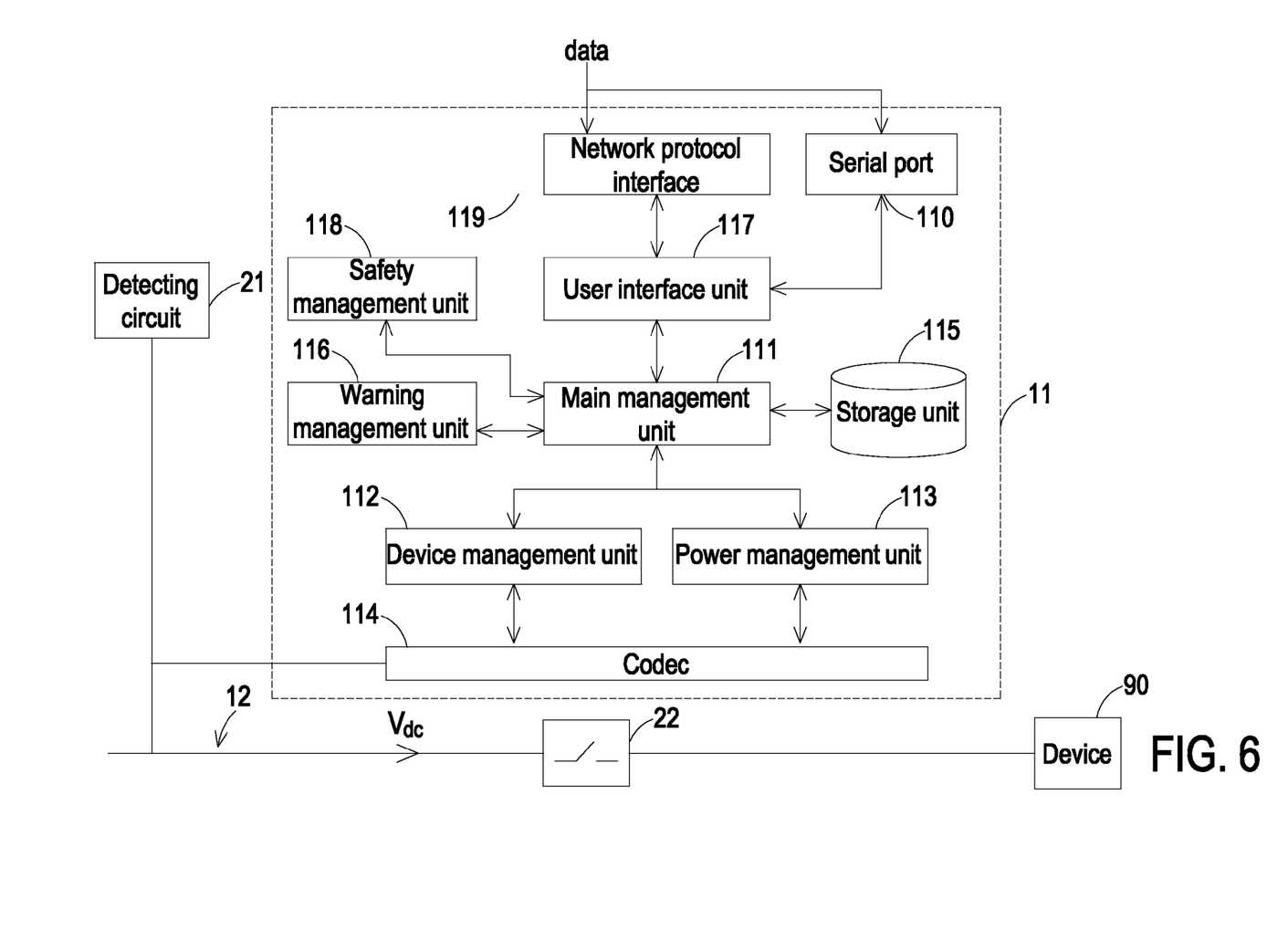
FIG. 6 is a schematic circuit block diagram illustrating the remote management module of the device management system of FIG. 1.

FIG. 6 is a schematic circuit block diagram illustrating the remote management module of the device management system of FIG. 1. As shown in FIG. 6, the remote management module 11 comprises a main management unit 111, a device management unit 112, a power management unit 113, a storage unit 115, a warning management unit 116, and a user interface unit 117. The power management unit 113 is connected with the bus bar 12 for monitoring the statuses of the device 90 (i.e. the status of receiving the DC power Vdc) which is connected with the remotely-controllable switching circuit 22. The device management unit 112 is connected with the bus bar 12 for collecting the information of the device 90 which is connected with the remotely-controllable switching circuit 22 in real time. The information of the device 90 is received by the main management unit 111 through the device management unit 112. Moreover, according to a setting condition, the information of the device 90 is analyzed and processed by the main management unit 111. For example, the setting condition includes a type of the device 90. That is, according to the type of the device 90, the information of the device 90 is analyzed and processed by the main management unit 111. Moreover, the power status of the device 90 may be realized by the main management unit 111 through the power management unit 113. Since the real-time data of the device 90 can be stored and analyzed by the main management unit 111, the main management unit 111 can provide the information about the maintenance and the life of the device 90. Moreover, the processed information of the device 90 and the power status of the device 90 may be stored into or read from the storage unit 115 by the main management unit 111. The user interface unit 117 is connected with the main management unit 111. Through the user interface unit 117, an external data may be inputted into the main management unit 111. The warning management unit 116 is connected with the main management unit 111. If the main management unit 111 confirms that a protection condition (e.g. an overvoltage protection condition, an overcurrent protection condition and/or an overloading protection condition) of the device 90 is satisfied according to the information of the device 90, the warning management unit 116 is driven to implement a waning process. In the warning process, the warning management unit 116 issues a waning sound, emits a warning light and/or transmits an electronic mail to notify the user that the device 90 needs to be protected.

In some embodiments, the remote management module 11 further comprises a codec 114, a safety management unit 118, a network protocol interface 119, and a serial port 110. The codec 114 is connected with the bus bar 12. When a signal from the bus bar 12 is received, the signal is decoded by the codec 114. In addition, the signal to be outputted from the remote management module 11 through the bus bar 12 is firstly encoded by the codec 114. The network protocol interface 119 is connected with the user interface unit 117. An example of the network protocol interface 119 includes but is not limited to a web protocol interface, a Telnet protocol interface or a simple network management protocol (SNMP) interface. Through the network protocol interface 119, the remote management module 11 may be controlled by an external device (not shown) or the user. The safety management unit 118 is connected with the main management unit 111. The safety management unit 118 is used for monitoring and filtering the identity of the user of the device 90, thereby increasing use safety of the device 90. The serial port 110 is connected with the user interface unit 117. An example of the serial port 110 includes but is not limited to a hyper-terminal. Through the serial port 110, the remote management module 11 may be controlled by an external device (not shown) or the user.

As mentioned above, the information of the device 90 is analyzed and processed by the main management unit 111 according to the setting condition. Moreover, the setting condition is stored in the storage unit 115. Moreover, for complying with the stored data and the operation modes of different devices 90, the setting condition stored in the storage unit 115 may be modified by the user through the network protocol interface 119 and/or the user interface unit 117.

From the above descriptions, the present invention provides a device management module, a remote management module and a device management system. The device management system uses the device management module and the remote management module to individually and remotely control the devices within the rack cabinet. If any device within the rack cabinet is suffered from breakdown or shutdown, according to a command from the remote management module, a switch element of a remotely-controllable switching circuit is controlled to be in an off state. Since the switch element is turned off, the DC power is no longer received by the device which is suffered from breakdown or shutdown. Consequently, the purpose of resuming the device is achieved. In comparison with the conventional method of manually resuming the device, the use of the device management system of the present invention is time-saving and labor-saving and has enhanced utilization flexibility. Moreover, the device management system of the present invention is capable of monitoring all devices of the rack cabinet. Moreover, the device management system of the present invention is capable of simultaneously monitoring all devices of the rack cabinet and storing and analyzing real-time data of the devices, thereby providing the information about the maintenance and the life of the device. Moreover, since the remote management module has additional function units (e.g. the safety management unit and the warning management unit), the device management system of the present invention has the function of protecting the devices of the rack cabinet.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A device management system for managing at least one device hot-swappable within a rack cabinet, the device management system comprising:
    a bus bar for transferring signals and DC power;
    a device management module for monitoring whether the device is installed in the rack cabinet and collecting information of the device which is installed in the rack cabinet, wherein the device management module comprises:
        at least one remotely-controllable switching circuit installed in an installation block, wherein a first end of the remotely-controllable switching circuit is connected with the bus bar, and a second end of the remotely-controllable switching circuit is connected with the device which is installed in the rack cabinet, wherein during operation of the remotely-controllable switching circuit, the information of the device is collected by the remotely-controllable switching circuit in real time; and
        a detecting circuit connected with the bus bar and in communication with the remotely-controllable switching circuit for detecting whether the device is installed in the rack cabinet, wherein a location table about a location of the remotely-controllable switching circuit in the installation block is previously stored in the detecting circuit, wherein when the device is installed in the rack cabinet, the remotely-controllable switching circuit connected with the device is enabled by the detecting circuit according to the location table; and a remote management module in communication with the remotely-controllable switching circuit and the detecting circuit through the bus bar, wherein the information of the device is acquired by the remote management module through the remotely-controllable switching circuit, wherein a switch element of the remotely-controllable switching circuit which is connected to the device is selectively turned on or turned off by the remote management module, wherein when the switch element is turned on, the DC power is transmitted to the device through the switch element.

2. The device management system according to claim 1, wherein the installation block is disposed within the rack cabinet, and wherein the number of the at least one remotely-controllable switching circuit is equal to the number of the at least one device.

3. The device management system according to claim 1, wherein when the device is installed in the rack cabinet and connected with the remotely-controllable switching circuit, the remotely-controllable switching circuit is enabled by the detecting circuit, wherein when the device is removed from the rack cabinet and disconnected from the remotely-controllable switching circuit, the remotely-controllable switching circuit is disabled by the detecting circuit.

4. The device management system according to claim 1, wherein the switch element is located in a path of transmitting the DC power to the device, and the switch element is connected with an input terminal of the device.

5. The device management system according to claim 1, wherein the remotely-controllable switching circuit has a unique identification number.

6. The device management system according to claim 5, wherein while the remotely-controllable switching circuit is enabled by the detecting circuit, the identification number is transmitted from the remotely-controllable switching circuit to the detecting circuit, wherein by comparing the identification number with the location table, an address of the remotely-controllable switching circuit connected with the device is realized by the detecting circuit.

7. The device management system according to claim 6, wherein after the address of the remotely-controllable switching circuit connected with the device is realized by the detecting circuit, the detecting circuit issues a registration message to the device, wherein according to the registration message, the device is registered to the remote management module, wherein according to the registration message, the switch element of the remotely-controllable switching circuit is controlled to be turned on or turned off by the remote management module, wherein the registration message contains a serial number of the rack cabinet, the identification number and a location identification code of the remotely-controllable switching circuit.

8. The device management system according to claim 5, wherein the remotely-controllable switching circuit further comprises:
a storage unit for storing the information of the device and storing the identification number;
a codec, wherein a signal received by the remotely-controllable switching circuit through the bus bar is decoded by the codec, wherein a signal to be outputted from the remotely-controllable switching circuit through the bus bar is firstly encoded by the codec;
a first handshaking circuit, wherein the first handshaking circuit and a second handshaking circuit of the detecting circuit are connected with each other, so that the remotely-controllable switching circuit and the detecting circuit are in communication with each other;
a controlling unit connected with the switch element for controlling the switch element to be turned on or turned off; and
a main circuit for controlling overall operations of the remotely-controllable switching circuit.

9. The device management system according to claim 1, wherein the detecting circuit further comprises:
a codec, wherein a signal received by the remotely-controllable switching circuit through the bus bar is decoded by the codec, wherein a signal to be outputted from the remotely-controllable switching circuit through the bus bar is firstly encoded by the codec;
a detecting unit for detecting whether the device is connected with the rack cabinet; and
a main circuit for controlling overall operations of the detecting circuit.

10. The device management system according to claim 9, wherein the detecting circuit further comprises a connection interface for receiving an external data, wherein the connection interface is a RS-232 interface or an Ethernet interface.

11. The device management system according to claim 1, wherein the remote management module further comprises:
a power management unit connected with the bus bar for monitoring the DC power which is received by the device;
a device management unit connected with the bus bar for collecting the information of the device which is connected with the remotely-controllable switching circuit in real time; and
a main management unit, wherein the information of the device is received by the main management unit through the device management unit, wherein the information of the device is analyzed and processed by the main management unit according to a setting condition, wherein a power status of the device is realized by the main management unit through the power management unit.

12. The device management system according to claim 11, wherein the setting condition includes a type of the device, wherein according to the type of the device, the information of the device is analyzed and processed by the main management unit.

13. The device management system according to claim 12, wherein the remote management module further comprises a storage unit, wherein after the information of the device is analyzed and processed by the main management unit, a processed information of the device is obtained, wherein the processed information and the power status are stored in or read from the storage unit in real time.

14. The device management system according to claim 13, wherein the remote management module further comprises:
a user interface unit connected with the main management unit, wherein an external data is inputted into the main management unit through the user interface unit; and
a warning management unit connected with the main management unit, wherein if the main management unit confirms that a protection condition of the device is satisfied, the warning management unit is driven to implement a waning process.

15. The device management system according to claim 14, wherein the protection condition comprises an overvoltage protection condition, an overcurrent protection condition and/or an overloading condition, wherein when the warning process is implemented, the warning management unit issues a waning sound, emits a warning light and/or transmits an electronic mail.

16. The device management system according to claim 14, wherein the remote management module further comprises a codec, and the codec is connected with the bus bar, wherein a signal received by the remote management module through the bus bar is decoded by the codec, wherein a signal to be outputted from the remote management module through the bus bar is firstly encoded by the codec.

17. The device management system according to claim 16, wherein the remote management module further comprises a network protocol interface, wherein the network protocol interface comprises a web protocol interface, a Telnet protocol interface and/or a simple network management protocol (SNMP) interface.

18. The device management system according to claim 17, wherein the remote management module further comprises a safety management unit, wherein the safety management unit is connected with the main management unit for monitoring and filtering an identity of a user of the device.

19. A device management module of a device management system for monitoring at least one device hot-swappable within a rack cabinet and collecting information of the at least one device, the device management module comprising:
  at least one remotely-controllable switching circuit installed in an installation block, wherein a first end of the remotely-controllable switching circuit is connected with a bus bar, and a second end of the remotely-controllable switching circuit is connected with the device which is installed in the rack cabinet, wherein during operation of the remotely-controllable switching circuit, the information of the device is collected by the remotely-controllable switching circuit in real time; and
  a detecting circuit connected with the bus bar and in communication with the remotely-controllable switching circuit for detecting whether the device is installed in the rack cabinet, wherein a location table about a location of the remotely-controllable switching circuit in the installation block is previously stored in the detecting circuit, wherein when the device is installed in the rack cabinet, the remotely-controllable switching circuit connected with the device is enabled by the detecting circuit according to the location table.

20. A remote management module of a device management system, the remote management module being in communication with a remotely-controllable switching circuit and a detecting circuit of the device management system through a bus bar, the remote management module comprising:
  a power management unit connected with the bus bar for monitoring a DC power which is received by a device connected with the remotely-controllable switching circuit;
  a device management unit connected with the bus bar for collecting information of the device connected with the remotely-controllable switching circuit in real time;
  a main management unit for receiving the information of the device through the device management unit, wherein the information of the device is analyzed and processed by the main management unit according to a setting condition, wherein a power status of the device is realized by the main management unit through the power management unit;
  a storage unit, wherein after the information of the device is analyzed and processed by the main management unit, a processed information of the device is obtained, wherein the processed information and the power status are stored in or read from the storage unit in real time;
  a user interface unit connected with the main management unit, wherein an external data is inputted into the main management unit through the user interface unit; and
  a warning management unit connected with the main management unit, wherein if the main management unit confirms that a protection condition of the device is satisfied, the warning management unit is driven to implement a waning process.

* * * * *